(12) United States Patent
Nagasaki

(10) Patent No.: US 9,129,966 B2
(45) Date of Patent: *Sep. 8, 2015

(54) SEMICONDUCTOR DEVICE

(71) Applicant: LAPIS Semiconductor Co., Ltd., Yokohama (JP)

(72) Inventor: Kenji Nagasaki, Tokyo (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/052,064

(22) Filed: Oct. 11, 2013

(65) Prior Publication Data

US 2014/0042635 A1 Feb. 13, 2014

Related U.S. Application Data

(63) Continuation of application No. 12/659,102, filed on Feb. 25, 2010, now Pat. No. 8,581,408.

(30) Foreign Application Priority Data

Feb. 26, 2009 (JP) .................................. 2009-044037

(51) Int. Cl.
*H01L 23/48* (2006.01)
*H01L 23/528* (2006.01)
*H01L 23/31* (2006.01)
*H01L 23/525* (2006.01)
*H01L 23/532* (2006.01)

(52) U.S. Cl.
CPC .......... *H01L 23/528* (2013.01); *H01L 23/5283* (2013.01); *H01L 23/3114* (2013.01); *H01L 23/525* (2013.01); *H01L 23/53257* (2013.01); *H01L 2924/0002* (2013.01)

(58) Field of Classification Search
USPC .............................................. 257/773, E2.142
See application file for complete search history.

(56) References Cited

U.S. PATENT DOCUMENTS

2007/0001308 A1* 1/2007 Takemura et al. ............ 257/758
2008/0023841 A1 1/2008 Nakasato et al.

FOREIGN PATENT DOCUMENTS

| JP | 57-026454 A | 2/1982 |
| JP | 62-104052 A | 5/1987 |
| JP | 63-054750 A | 3/1988 |
| JP | 05-144809 A | 6/1993 |
| JP | 06-0136590 A | 1/1994 |
| JP | 10-270445 A | 10/1998 |

OTHER PUBLICATIONS

Foreign Office Action issued on Oct. 1, 2013 with an English translation.

* cited by examiner

*Primary Examiner* — Timor Karimy

(74) *Attorney, Agent, or Firm* — Rabin & Berdo, P.C.

(57) ABSTRACT

One wiring width of upper and lower wiring paths formed facing each other sandwiching an interlayer insulating film is large, and another wiring width is small; and the wiring widths of mutually adjacent wiring paths are formed to be large and small in alternating fashion on the same wiring layer.

16 Claims, 5 Drawing Sheets

US 9,129,966 B2

SEMICONDUCTOR DEVICE

CROSS-REFERENCE TO RELATED APPLICATIONS

This application is a continuation of application Ser. No. 12/659,102, filed on Feb. 25, 2010. Furthermore, this application claims the benefit of priority of Japanese application 2009-044037 filed on Feb. 26, 2009. The disclosures of these prior U.S. and Japanese applications are incorporated herein by reference.

BACKGROUND OF THE INVENTION

1. Field of the Invention

The present invention relates to a semiconductor device having a multilayered wiring structure in which an insulating layer and a wiring layer are layered in alternating fashion on a semiconductor substrate.

2. Description of the Related Art

Semiconductor devices having a multilayered wiring structure are known, e.g., a WCSP (Wafer Level Chip Size Package) or the like, in which an insulating layer and a wiring layer are layered in an alternating fashion on a semiconductor substrate. In a multilayered wiring structure, steps are generally generated in the surface of the interlayer insulating film in accordance with the underlying or lower layer-wiring pattern. This causes variability in the shape and in the wiring width of an upper layer-wiring pattern and some countermeasure is thus required. For example, Japanese Laid-open Patent Application Kokai No. 62-104052 (hereinafter referred to as Patent Document 1) discloses a semiconductor device having a structure in which the upper layer-wiring paths are offset by 2 μm or more in the width direction in relation to the lower layer-wiring paths, and a structure in which the width of the lower layer-wiring paths is made greater than the width of the upper layer-wiring paths.

SUMMARY OF THE INVENTION

However, in the case that the wiring paths are offset in the width direction or in the case that the wiring width is merely increased, the pitch between wiring is increased when two or more wiring paths are formed in a mutually opposing fashion. Accordingly, there is a problem in that the WCSP and the like device that need to be small in size become larger as a result.

The present invention was contrived in view of the foregoing problems and an object thereof is to provide a small-sized semiconductor device having a multilayered wiring structure in which abnormalities in the shape of the wiring pattern do not occur.

The semiconductor device of the present invention is a semiconductor device having a plurality of insulating layers and a plurality of wiring layers layered in alternating fashion on a semiconductor device, the semiconductor device comprising a first upper-side wiring path formed in an upper-side wiring layer among two wiring layers that are layered so as to sandwich the insulating layer, the wiring width of the first upper-side wiring path being smaller than the wiring width of a first lower-side wiring path formed in the lower-side wiring layer so as to face the first upper-side wiring path; and a second upper-side wiring path formed adjacent to the first upper-side wiring path, the wiring width of the second upper-side wiring path being greater than the wiring width of a second lower-side wiring path formed adjacent to the first lower-side wiring path and facing the second upper-side wiring path.

In accordance with the semiconductor device of the present invention, the semiconductor device can be made smaller.

DESCRIPTION OF THE PREFERRED EMBODIMENTS

Embodiments of the present invention will be described in detail hereinafter with reference to the accompanying drawings.

Figure 1A:
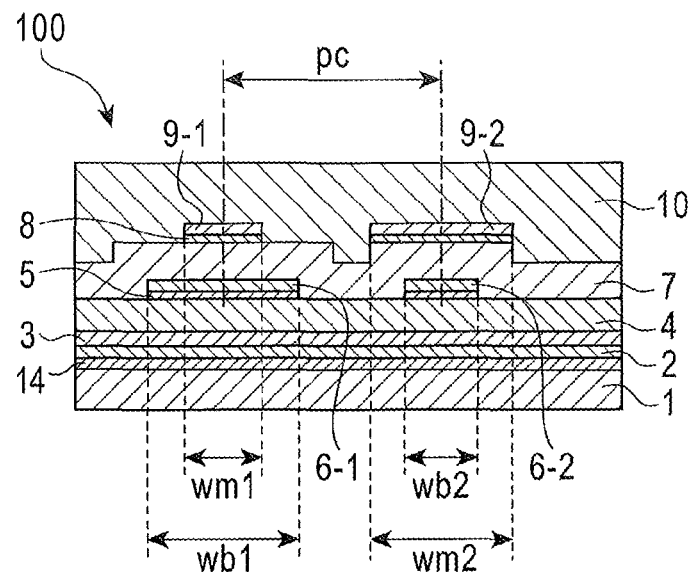
FIG. 1A is a cross-sectional view of a semiconductor device according to the first embodiment of the invention.

FIG. 1A is a cross-sectional view of the semiconductor device 100 of the present embodiment. The configuration of the semiconductor device 100 will be described below with reference to FIG. 1A.

The semiconductor substrate 1 is a substrate composed of a semiconductor such as silicon and the like.

A surface insulating layer 2 is an oxide film composed of, e.g., $SiO_2$ formed by, e.g., CVD (chemical vapor deposition) on the surface of the semiconductor substrate 1.

A protective film 3 is a nitride film composed of, e.g., $Si_3N_4$ formed by, e.g., CVD on the surface of the surface insulating layer 2.

The first insulating layer 4 is composed of an organic resin material, e.g., polybenzoxazole (PBO) or the like that is coated by, e.g., spin coating on the surface of the protective film 3, is cured by, e.g., a heat treatment, and has insulating properties and positive or negative photosensitivity. The thickness of the first insulating layer 4 as the so-called interlayer insulating film is, e.g., 5 μm.

A first underlying metal layer 5 is composed of, e.g., titanium (Ti), copper (Cu), or the like formed by, e.g., sputtering on the surface of the first insulating layer 4.

First wiring paths 6-1, 6-2 are electroconductive paths composed of a metal material, e.g., copper (Cu) or the like formed by, e.g., electroplating on the surface of the first underlying metal layer 5. The first wiring paths 6-1, 6-2 are formed by forming a first wiring layer including the first wiring paths to a thickness of, e.g., 5 μm by, e.g., electroplating on the surface of the first underlying metal layer 5, and thereafter removing the unneeded portions of the first underlying metal layer 5.

A second insulating layer 7 is composed of an organic resin material, e.g., PBO or the like that is coated by, e.g., spin coating on the surface of the first insulating layer 4 and the first wiring paths 6-1, 6-2, is cured by, e.g., a heat treatment, and has insulating properties and positive or negative photosensitivity. The thickness of the second insulating layer 7 as the so-called interlayer insulating film is, e.g., 10 μm. Steps are generated in the portions of the surface of the second insulating layer 7 that correspond to the edges of the first wiring paths 6-1, 6-2 in the width direction.

A second underlying metal layer 8 is composed of, e.g., titanium (Ti), copper (Cu), or the like formed by, e.g., sputtering on the surface of the second insulating layer 7.

Second wiring paths 9-1, 9-2 are electroconductive paths composed of a metal material, e.g., copper (Cu) or the like formed by, e.g., electroplating on the surface of the second underlying metal layer 8. The second wiring paths 9-1, 9-2 are formed by forming a second wiring layer including the second wiring paths to a thickness of, e.g., 5 μm by, e.g., electroplating on the surface of the second underlying metal layer 8, and thereafter removing the unneeded portions of the second underlying metal layer 8.

A sealing layer 10 is, e.g., an epoxy molding resin having heat curing properties and insulating properties, and is formed by heat treatment so as to embed the second wiring paths 9-1, 9-2 on the surface of the second insulating layer 7, A plurality of wiring paths, other than the first wiring paths 6-1, 6-2 and the second wiring paths 9-1, 9-2, that are not shown is ordinarily formed on the semiconductor device 100. Vias (not shown) for electrically connecting the wiring paths formed on the layers different from each other, such as the first wiring path 6-1 and the second wiring path 9-1, for example, are formed in the semiconductor device 100. An electrode post having, e.g., a columnar shape, and an electrode terminal such as a solder ball or the like (neither are shown) are formed on, e.g., the wiring path such as the second wiring path 9-1 and on the end surface of the electrode post, respectively, on the semiconductor device 100.

Figure 1B:
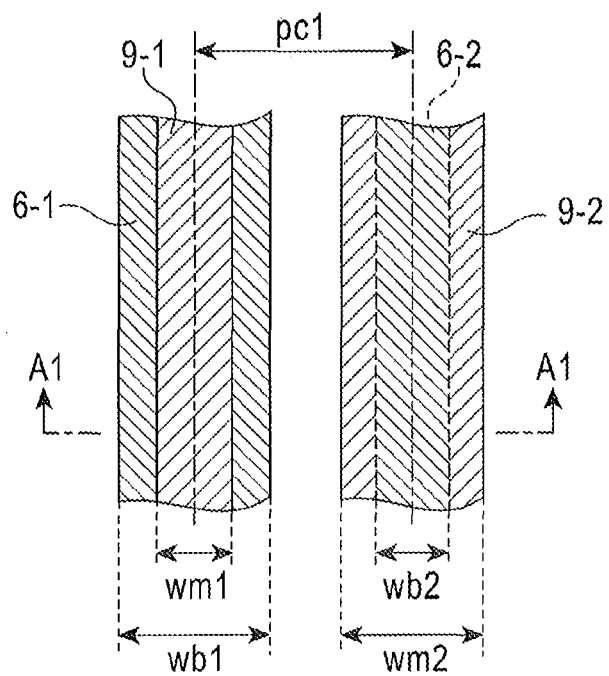
FIG. 1B is a plan view of the first and second wiring paths as seen from the upper surface.

FIG. 1B is a plan view of the first wiring paths 6-1, 6-2 and the second wiring paths 9-1, 9-2 in the semiconductor device 100 as seen from the upper surface. FIG. 1A shows a cross section of the A1-A1 portion of FIG. 1B. The wiring paths (6-1, 6-2, 9-1, and 9-2) will mainly be described below with reference to FIGS. 1A and 1B.

The first wiring path 6-1 having a wiring width wb1 and the first wiring path 6-2 having a wiring width wb2 are formed adjacent to each other in the first wiring layer (lower-side wiring layer). The second wiring path 9-1 having a wiring width wm1 and the second wiring path 9-2 having a wiring width wm2 are formed adjacent to each other in the second wiring layer (upper-side wiring layer). The first wiring path 6-1 formed in the first wiring layer as a lower layer and the second wiring path 9-1 formed in the second wiring layer as an upper layer are formed facing each other. Similarly, the first wiring path 6-2 formed in the first wiring layer and the second wiring path 9-2 formed in the second wiring layer are formed facing each other.

The wiring width wb1 of the first wiring path 6-1 is greater than the wiring width wm1 of the second wiring path 9-1. On the other hand, the wiring width wb2 of the first wiring path 6-2 is smaller than the wiring width wm2 of the second wiring path 9-2. The wiring width wb1 of the first wiring path 6-1 and the wiring width wm2 of the second wiring path 9-2 are generally the same or substantially the same, but these widths may differ. The wiring width wm1 of the second wiring path 9-1 and the wiring width wb2 of the first wiring path 6-2 are also generally the same or substantially the same, but these widths may differ. The pitch pc1 between the first wiring path 6-1 and the first wiring path 6-2, and between the second wiring path 9-1 and the second wiring path 9-2 is preferably made as small as possible in order to reduce the size of the semiconductor device 100.

Shown below are examples of the wiring widths wb1, wb2, wm1, wm2, and the pitch pc1. The wiring widths wb1, wb2, wm1, wm2 are not particularly limited, but are in a range of about, e.g., 5 to 150 μm. The wiring width wb1 of the first wiring path 6-1 is, e.g., 70 μm. The wiring width wm1 of the second wiring path 9-1 is, e.g., 20 μm. The wiring width wb2 of the first wiring path 6-2 is, e.g., 20 μm. The wiring width wm2 of the second wiring path 9-1 is, e.g., 70 μm.

The pitch pc1 between the second wiring path 9-1 and the second wiring path 9-2 in this case is, e.g., 90 μm. The 90-μm pitch pc1 of 90 μm is obtained from the sum of the 70-μm wiring width wm1 and the 20-μm wiring width wm2. A small tolerance interval of 10 μm is furthermore added due to, e.g., manufacturing limits or the like, and the pitch pc1 may be set to 100 μm. Also, the pitch pc1 may be set to 180 μm, which is twice the sum of the 70-μm wiring width wm1 and the 20-μm wiring width wm2, by adjusting the manufacturing conditions. Similarly, the pitch pc1 between the first wiring path 6-1 and the first wiring path 6-2 is, e.g., 90 to 180 μm.

The relationship between the wiring width wb1 of the first wiring path 6-1 and the wiring width wm2 of the second wiring path 9-2 is not necessarily required to be the same or substantially the same. For example, the wiring width wb1 may be 150 μm, and the wiring width wm2 may be 100 μm. In this case, the wiring width wm1 may be, e.g., 120 μm and the wiring width wb2 may be 60 μm. The same applies to the relationship between the wiring width wb2 of the first wiring path 6-2 and the wiring width wm1 of the second wiring path 9-1.

The wiring paths of the first wiring paths 6-1, 6-2 and the second wiring paths 9-1, 9-2 may be signal wires for transmitting data signals or other electric signals, or may be power source wires for supplying power source voltage or ground voltage.

Figure 2:
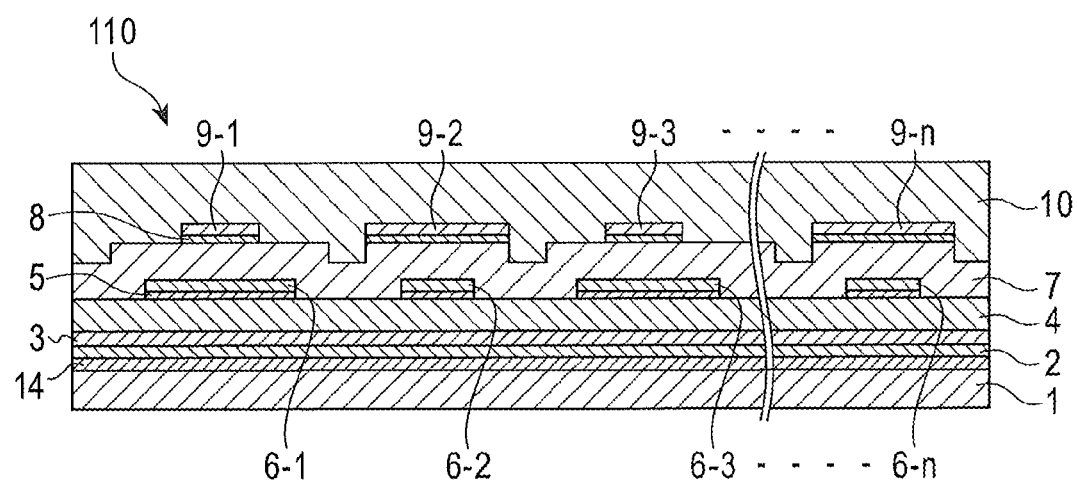
FIG. 2 is a cross-sectional view of a semiconductor device in which three or more wiring paths are formed.

FIG. 2 shows a semiconductor device 110 in which a configuration such as that described above is continuous and iterative. First wiring paths 6-1 to 6-n and second wiring paths 9-1 to 9-n (where "n" is an integer of 3 or greater) are formed in the same relationship as that described above in the semiconductor device 110. Thus, three or more wiring paths can be adjacently formed as required.

Figure 3:
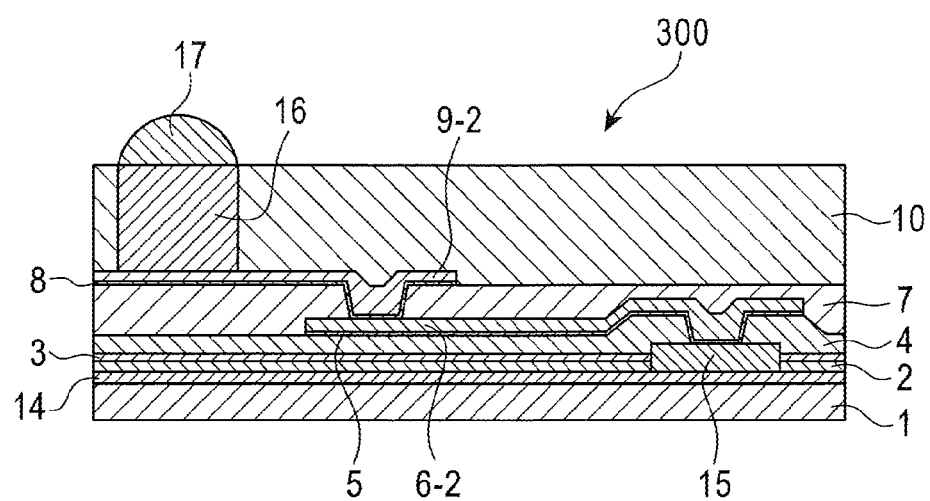
FIG. 3 is a cross-sectional view of the WCSP as the semiconductor device.

The semiconductor device 100 of the present embodiment is, e.g., a WCSP (wafer level chip size package), which is a semiconductor device having multilayered wiring structure. FIG. 3 is a cross-sectional view of the WCSP 300.

A semiconductor circuit 14 in which, e.g., an amplifier circuit, a computing circuit, or the like are integrated is formed on the semiconductor substrate 1. The surface insulating layer 2 composed of, e.g., $SiO_2$ is formed on the semiconductor circuit 14. An electrode pad 15 electrically connected to the semiconductor circuit 14 is furthermore formed on the semiconductor circuit 14.

The protective film 3 composed of, e.g., a nitride film, and the first insulating layer 4 composed of an organic resin material, e.g., PBO or the like are formed on the surface insulating layer 2 and are provided with an opening for exposing the surface of the electrode pad 15. A first wiring path 6-2 that accompanies the first underlying metal layer 5 composed of, e.g., titanium is formed on the first insulating layer 4. One end of the first wiring path 6-2 is electrically connected to the surface of the electrode pad 15 via the opening, and the other end is formed so as to extend over the first insulating layer 4.

The second insulating layer 7 composed of an organic resin material, e.g., PBO or the like is provided with an opening for exposing the other end of the first wiring path 6-2 and is formed on the first insulating layer 4. The second wiring path 9-2 that accompanies the second underlying metal layer 8 composed of, e.g., titanium is formed on the second insulating layer 7. One end of the second wiring path 9-2 is electrically connected to the other end of the first wiring path 6-2 via the opening, and the other end of the second wiring path 9-2 is formed so as to extend over the second insulating layer 7.

The sealing layer 10 composed of a molding resin, e.g., epoxy or the like is formed so as to cover the second insulating layer 7 and the second wiring path 9-2. The other end of the second wiring path 9-2 is electrically connected to an external electrode 17, e.g., a solder ball or the like via an electrode post 16 composed of, e.g., copper. Numerous wiring paths, electrode pads, electrode posts, and external electrodes that are not shown in the drawings are generally formed in the same manner on the WCSP.

Thus, the multilayered wiring structure of the present embodiment is not used in relation to the wiring layer constituting the integrated circuit in the semiconductor chip, but is rather used in relation to the so-called rewiring structure in a semiconductor device, e.g., a WCSP or the like having a multilayered wiring structure.

In accordance with the semiconductor device having a multilayered wiring structure of the present embodiment as described above, one wiring width of upper and lower wiring paths formed sandwiching an interlayer insulating film is large, and another wiring width is small; and the wiring widths of mutually adjacent wiring paths are formed to be large and small in alternating fashion in the same wiring layer. The pitch between the wiring paths can thereby be reduced and the semiconductor device can be made smaller. Also, abnormalities do not occur in the shape of the wiring paths due the effect of steps in the interlayer insulating film.

Second Embodiment

Figure 4A:
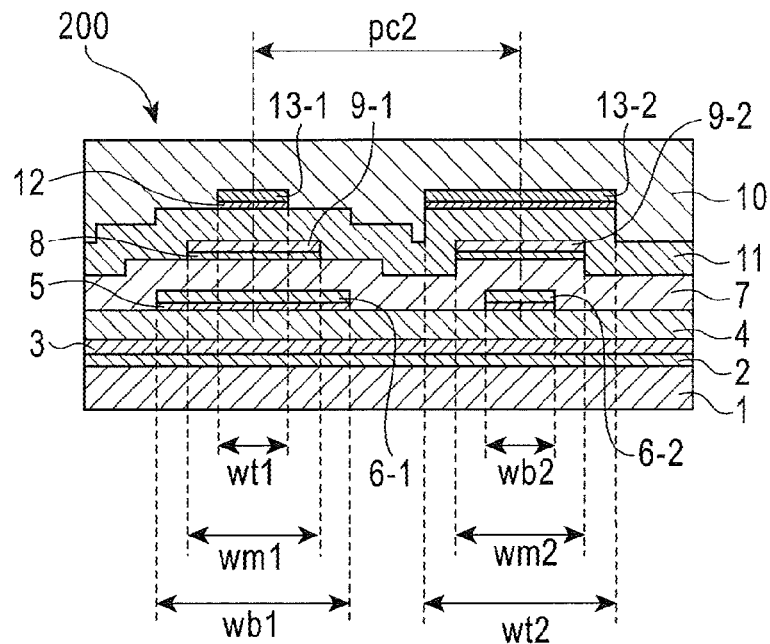
FIG. 4A is a cross-sectional view of a semiconductor device according to the second embodiment.

FIG. 4A is a cross-sectional view of a semiconductor device 200 of the second embodiment. The first embodiment is the semiconductor device 100 in which two wiring layers are layered, but application can also be made to the semiconductor device 200 in which 3 wiring layers are layered, as shown in FIG. 4A.

Figure 4B:
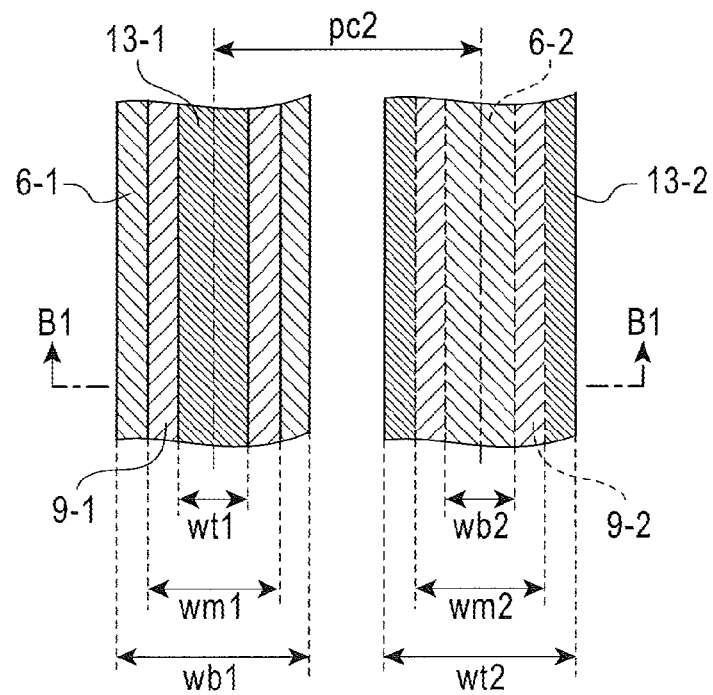
FIG. 4B is a plan view of the first, second, and third wiring paths as seen from the upper surface.

FIG. 4B is a plan view of the first wiring paths 6-1, 6-2, the second wiring paths 9-1, 9-2, and third wiring paths 13-1, 13-2 as seen from the upper surface. FIG. 4A shows the cross section of the B1-B1 portion of FIG. 4B. The wiring paths (6-1, 6-2, 9-1, 9-2, 13-1, and 13-2) will mainly be described below with reference to FIGS. 4A and 4B.

The first wiring path 6-1 having a wiring width wb1 and the first wiring path 6-2 having a wiring width wb2 are formed adjacent to each other in the first wiring layer. The second wiring path 9-1 having a wiring width wm1 and the second wiring path 9-2 having a wiring width wm2 are formed adjacent to each other in the second wiring layer. The third wiring path 13-1 having a wiring width wt1 and the third wiring path 13-2 having a wiring width wt2 are formed adjacent to each other in the third wiring layer. The first wiring path 6-1, the second wiring path 9-1, and the third wiring path 13-1 are formed facing each other. Similarly, the first wiring path 6-2, the second wiring path 9-2, and the third wiring path 13-2 are formed facing each other.

The wiring width wb1 of the first wiring path 6-1 is greater than the wiring width wm1 of the second wiring path 9-1. The wiring width wm1 is greater than the wiring width wt1 of the third wiring path 13-1. On the other hand, the wiring width wb2 of the first wiring path 6-2 is smaller than the wiring width wm2 of the second wiring path 9-2. The wiring width wm2 is smaller than the wiring width wt2 of the third wiring path 13-2.

The wiring width wb1 of the first wiring path 6-1 and the wiring width wt2 of the third wiring path 13-2 are ordinarily the same or substantially the same, but these widths may differ. The wiring width wm1 of the second wiring path 9-1 and the wiring width wm2 of the second wiring path 9-2 are also ordinarily the same or substantially the same, but these widths may differ. The wiring width wt1 of the third wiring path 13-1 and the wiring width wb2 of the first wiring path 6-2 are also ordinarily the same or substantially the same.

The pitch pc2 between the first wiring path 6-1 and the first wiring path 6-2, between the second wiring path 9-1 and the second wiring path 9-2, and between the third wiring path 13-1 and the third wiring path 13-2 is preferably made as small as possible in order to reduce the size of the semiconductor device 200.

Shown below are examples of the wiring widths wb1, wb2, wm1, wm2, wt1, wt2, and the pitch pc2. The wiring widths wb1, wb2, wm1, wm2, wt1, and wt2 are not particularly limited, but are in a range of about, e.g., 5 to 150 μm. The wiring widths wb1 and wt2 are each, e.g., 150 μm. The wiring widths wm1 and wm2 are each, e.g., 85 μm. The wiring widths wt1 and wb2 are each, e.g., 20 μm.

The pitch pc2 between the third wiring path 13-1 and the third wiring path 13-2 in this case is, e.g., 170 μm. The 170-μm pitch pc2 is obtained from the sum of the 20-μm wiring width wt1 and the 150-μm wiring width wt2. A small tolerance interval of 10 μm is furthermore added due to, e.g., manufacturing limits or the like, and the pitch pc2 may be set to 180 μm. Also, the pitch pc2 may be set to 340 μm, which is twice the sum of the 20-μm wiring width wt1 and the 150-μm wiring width wt2, by adjusting the manufacturing conditions. Similarly, the pitch pc2 between the second wiring path 9-1 and the second wiring path 9-2, and between the first wiring path 6-1 and the first wiring path 6-2 is, e.g., 170 to 340 μm.

Figure 5:
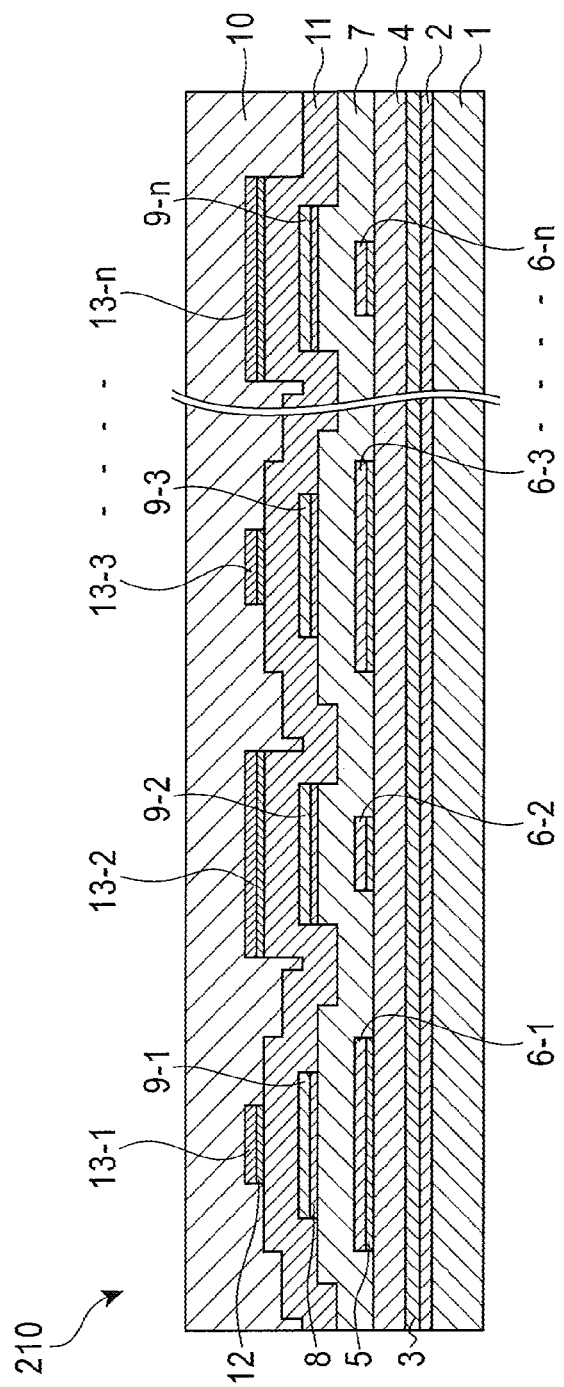
FIG. 5 is a cross-sectional view of the semiconductor device in which three or more wiring paths are formed.

FIG. 5 shows a semiconductor device 210 in which a configuration such as that described above is continuous and iterative. First wiring paths 6-1 to 6-n, second wiring paths 9-1 to 9-n, and third wiring path 13-1 to 13-n (where "n" is an integer of 3 or greater) are formed in the same relationship as that described above in the semiconductor device 210. Thus, three or more wiring paths can be adjacently formed as required.

In accordance with the semiconductor device having a multilayered wiring structure of the present embodiment as described above, the pitch between the wiring paths can be reduced in a semiconductor device in which three or more wiring layers are integrated, and the semiconductor device can be made smaller. Also, abnormalities do not occur in the shape of the wiring paths due the effect of steps in the interlayer insulating film.

The first and second embodiments are examples in which there are two and three wiring layers, respectively, but the pitch between the wiring layers can be reduced and the semiconductor device can be made smaller by configuring the semiconductor device with the same configuration in the case that four or more wiring layers are used.

The invention has been described with reference to the preferred embodiments thereof. It should be understood by those skilled in the art that a variety of alterations and modifications may be made from the embodiments described above. It is therefore contemplated that the appended claims encompass all such alternations and modifications.

What is claimed is:

1. A semiconductor device of a CSP (chip size package) comprising:
   a semiconductor chip which includes a semiconductor substrate and a semiconductor circuit formed on said semiconductor substrate;
   an electrode pad that is formed on said semiconductor chip and electrically connected to said semiconductor circuit; and a rewiring structure which includes:
    a plurality of insulating layers and a plurality of wiring layers layered on said semiconductor chip and said electrode pad;
    a first lower-side wiring path;
    a first upper-side wiring path formed above said first lower-side wiring path, said first upper-side wiring path having a wiring width narrower than a wiring width of said first lower-side wiring path;
    a second lower-side wiring path formed in a same layer in which said first lower-side wiring path is formed;
    a second upper-side wiring path formed above said second lower side wiring path, said second upper-side wiring path having a wiring width wider than a wiring width of said second lower-side wiring path; and
    at least one of said plurality of insulating layers which is formed between said first lower-side wiring path and said first upper-side wiring path and between said second lower-side wiring path and said second upper-side wiring path, wherein
    said first lower-side wiring path and said second lower-side wiring path are formed on one or more of said plurality of insulating layers;
    at least one of said first lower-side wiring path and said second lower-side wiring path is electrically connected to said electrode pad; and
    said first upper-side wiring path and said second upper-side wiring path are formed on said plurality of insulating layers.

2. The semiconductor device of claim 1, wherein the wiring width of said second upper-side wiring path is greater than the wiring width of said first upper-side wiring path, and the wiring width of the second lower-side wiring path is less than the wiring width of the first lower-side wiring path.

3. The semiconductor device of claim 2, wherein a pitch between said first lower-side wiring path and said second lower-side wiring path is 1 to 2 times a sum of the wiring width of the first lower-side wiring path and the wiring width of the second lower-side wiring path.

4. The semiconductor device of claim 2, wherein a pitch between said first upper-side wiring path and said second upper side wiring path is 1 to 2 times a sum of the wiring width of the first upper-side wiring path and the wiring width of the second upper-side wiring path.

5. The semiconductor device of claim 2, wherein the wiring width of the first upper-side wiring path is substantially identical to the wiring width of the second lower-side wiring path, and the wiring width of the second upper-side wiring path is substantially identical to the wiring width of the first lower-side wiring path.

6. The semiconductor device of claim 1, wherein a pitch between said first lower-side wiring path and said second lower-side wiring path is 1 to 2 times a sum of the wiring width of the first lower-side wiring path and the wiring width of the second lower-side wiring path.

7. The semiconductor device of claim 6, wherein the wiring width of the first upper-side wiring path is substantially identical to the wiring width of the second lower-side wiring path, and the wiring width of the second upper-side wiring path is substantially identical to the wiring width of the first lower-side wiring path.

8. The semiconductor device of claim 1, wherein a pitch between said first upper-side wiring path and said second upper-side wiring path is 1 to 2 times a sum of the wiring width of the first upper-side wiring path and the wiring width of the second upper-side wiring path.

9. The semiconductor device of claim 1, wherein the wiring widths of said first and second upper-side wiring paths are measured along a line that extends through both of said first and second upper-side wiring paths.

10. The semiconductor device of claim 9, wherein the wiring width of said first and second lower side wiring path are measured along another line that extends through both said first and second lower-side wiring paths.

11. The semiconductor device of claim 10, wherein no other wiring paths are disposed between said first and second upper-side wiring paths, and no other wiring paths are disposed between said first and second lower-side wiring paths.

12. The semiconductor device of claim 9, wherein the lower-side wiring layer and the upper-side wiring layer are disposed on another line that is perpendicular to the line that extends through both said first and second upper-side wiring paths.

13. The semiconductor device of claim 1, wherein the second upper-side wiring path is disposed in the upper side wiring layer and the second lower-side wiring path is disposed in the lower-side wiring layer.

14. The semiconductor device of claim 1, wherein said plurality of insulating layers are composed of an organic resin material.

15. The semiconductor device of claim 1, further comprising:
    a sealing layer which covers said plurality of insulating layers and said first upper-side wiring path and said second upper-side wiring path, at least one of said first upper-side wiring path and said second upper-side wiring path being electrically connected to at least one of said first lower-side wiring path and said second lower-side wiring path, and
    an external electrode which is connected to said first upper-side wiring path or said second upper-side wiring path via said sealing layer.

16. A semiconductor device comprising:
    a semiconductor chip which includes a semiconductor substrate and a semiconductor circuit formed on said semiconductor substrate;
    an electrode pad that is formed on said semiconductor chip and electrically connected to said semiconductor circuit;
    a plurality of insulating layers and a plurality of wiring layers layered on said semiconductor chip and said electrode pad;
    a first lower-side wiring path;
    a first upper-side wiring path formed above said first lower-side wiring path, said first upper-side wiring path having a wiring width narrower than a wiring width of said first lower-side wiring path;
    a second lower-side wiring path formed in a same layer in which said first lower-side wiring path is formed;
    a second upper-side wiring path formed above said second lower side wiring path, said second upper-side wiring path having a wiring width wider than a wiring width of said second lower-side wiring path; and
    at least one of said plurality of insulating layers which is formed between said first lower-side wiring path and said first upper-side wiring path and between said second lower-side wiring path and said second upper-side wiring path,
    wherein the insulating layers include three or more insulating layers and further include at least one more wiring layer,
    said first lower-side wiring path and said second lower-side wiring path are formed on one or more of said plurality of insulating layers;

at least one of said first lower-side wiring path and said second lower-side wiring path is electrically connected to said electrode pad; and said first upper-side wiring path and said second upper-side wiring path are formed on said plurality of insulating layers.

\* \* \* \* \*